US011210064B2

United States Patent
Payer et al.

(10) Patent No.: US 11,210,064 B2
(45) Date of Patent: Dec. 28, 2021

(54) PARALLELIZED ROUNDING FOR DECIMAL FLOATING POINT TO BINARY CODED DECIMAL CONVERSION

(71) Applicant: International Business Machines Corporation, Armonk, NY (US)

(72) Inventors: Stefan Payer, Stuttgart (DE); Silvia Melitta Mueller, Altdorf (DE); Nicol Hofmann, Leinfelden-Echterdingen (DE); Razvan Peter Figuli, Remchingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 236 days.

(21) Appl. No.: 16/525,720

(22) Filed: Jul. 30, 2019

(65) Prior Publication Data
US 2021/0034328 A1 Feb. 4, 2021

(51) Int. Cl.
*G06F 7/499* (2006.01)
*H03M 7/24* (2006.01)
*H03M 7/12* (2006.01)

(52) U.S. Cl.
CPC .......... *G06F 7/49947* (2013.01); *H03M 7/12* (2013.01); *H03M 7/24* (2013.01)

(58) Field of Classification Search
CPC . H03M 7/08; H03M 7/12; H03M 7/24; G06F 7/49947–49984; G06F 7/38–575
See application file for complete search history.

(56) References Cited

U.S. PATENT DOCUMENTS

| 3,842,414 | A | * | 10/1974 | Chen | H03M 7/12 341/83 |
| 5,170,371 | A | * | 12/1992 | Darley | G06F 7/4876 708/204 |
| 5,235,533 | A | * | 8/1993 | Sweedler | G06F 7/483 708/204 |
| 5,251,321 | A | * | 10/1993 | Boothroyd | H03M 7/12 341/84 |
| 7,921,144 | B2 | | 4/2011 | Hack | |
| 8,364,734 | B2 | | 1/2013 | Carlough et al. | |
| 8,719,322 | B2 | | 5/2014 | Bishop | |
| 8,977,663 | B2 | | 3/2015 | Lee et al. | |
| 2006/0047739 | A1 | * | 3/2006 | Schulte | G06F 7/485 708/495 |

(Continued)

OTHER PUBLICATIONS

S. Carlough, A. Collura, S. Mueller and M. Kroener, "The IBM zEnterprise-196 Decimal Floating-Point Accelerator,"2011 IEEE 20th Symposium on Computer Arithmetic, 2011, pp. 139-146, doi: 10.1109/ARITH.2011.27. (Year: 2011).*

(Continued)

*Primary Examiner* — Jaweed A Abbaszadeh
*Assistant Examiner* — Carlo Waje
(74) *Attorney, Agent, or Firm* — Cantor Colburn LLP; Margaret McNamara

(57) ABSTRACT

A computer-implemented method includes: receiving, using a processor, a decimal floating point number; and using a floating point unit within the processor to convert the decimal floating point number into a binary coded decimal number, wherein the floating point unit starts a conversion loop subsequent to a rounding loop starting, wherein the rounding loop and the conversion loop run in parallel once started.

20 Claims, 5 Drawing Sheets

(56) References Cited

U.S. PATENT DOCUMENTS

| | | | |
|---|---|---|---|
| 2006/0101425 A1* | 5/2006 | Donovan | G06F 8/443 717/136 |
| 2006/0179090 A1* | 8/2006 | Carlough | H03M 7/12 708/204 |
| 2007/0061387 A1* | 3/2007 | Carlough | H03M 7/24 708/204 |
| 2008/0215659 A1* | 9/2008 | Cowlishaw | G06F 7/49957 708/497 |
| 2008/0238736 A1 | 10/2008 | Mathew et al. | |
| 2010/0306632 A1* | 12/2010 | Carlough | H03M 7/12 714/801 |
| 2010/0312812 A1* | 12/2010 | Wang | G06F 17/10 708/505 |
| 2012/0124116 A1 | 5/2012 | Yu et al. | |
| 2012/0259906 A1* | 10/2012 | Kan | G06F 7/483 708/505 |
| 2013/0304785 A1 | 11/2013 | Lutz et al. | |
| 2014/0046994 A1* | 2/2014 | Kamoshida | G06F 7/483 708/505 |
| 2014/0115023 A1* | 4/2014 | Ayoub | H03M 7/12 708/683 |
| 2016/0092169 A1 | 3/2016 | Lutz et al. | |
| 2016/0098248 A1* | 4/2016 | Carlough | G06F 7/49947 708/201 |
| 2016/0098249 A1 | 4/2016 | Carlough et al. | |
| 2017/0199724 A1 | 7/2017 | Cowlishaw et al. | |

OTHER PUBLICATIONS

A. A. Wahba and H. A. H. Fahmy, "Area Efficient and Fast Combined Binary/Decimal Floating Point Fused Multiply Add Unit," in IEEE Transactions on Computers, vol. 66, No. 2, pp. 226-239, Feb. 1, 2017, doi: 10.1109/TC.2016.2584067. (Year: 2017).*

Transmittal Form PTO/SB/21 , signed Mar. 17, 2020.

List of IBM Patents or Patent Applications Treated as Related; (Appendix P); Date Filed: Jul. 30, 2019, 2 pages.

Stefan Payer et al., "Parallel Rounding for Conversion From Binary Floating Point to Binary Coded Decimal," U.S. Appl. No. 16/525,768, filed Jul. 30, 2019.

M. DeJong, "A Floating-Point Binary to BCD Routine" in Compute! Issue 11 p. 66. Retrieved on [May 20, 2021]. Retrieved from the internet<https://www.atarimagazine.com/compute/issue11/31_1_A_FLOATING_255POINT_BINARY_TO_BCD_ROUTINE.php>(Year: 1981).

* cited by examiner

PARALLELIZED ROUNDING FOR DECIMAL FLOATING POINT TO BINARY CODED DECIMAL CONVERSION

BACKGROUND

The present invention relates to decimal floating point (DFP) number conversion to binary coded decimal (BCD) number conversion, and more specifically, to parallel rounding in converting a DFP number to a BCD number.

Decimal floating point units in modern microprocessor designs are optimized to do basic multiply and add (result=a*b+c) in a very efficient way. To support the high frequencies of modern microprocessors, the logic is separated into different pipeline stages. Each pipeline stage does a specific part of the multiply and add as well as some more features to support more instructions and operations.

SUMMARY

According to embodiments of the present invention, a computer-implemented method includes: receiving, using a processor, a decimal floating point number; and using a floating point unit within the processor to convert the decimal floating point number into a binary coded decimal number, wherein the floating point unit starts a conversion loop subsequent to a rounding loop starting, wherein the rounding loop and the conversion loop run in parallel once started.

According to another embodiment of the present invention, a system including a receiving module configured to receive a decimal floating point number; and a floating point unit configured to convert the decimal floating point number into a binary coded decimal number, wherein the floating point unit starts a conversion loop subsequent to a rounding loop starting, wherein the rounding loop and the conversion loop run in parallel once started.

According to yet another embodiment of the present invention, a computer program product including: one or more computer-readable storage media, wherein the computer readable storage media are not transitory signals per se; first program instructions, stored on at least one of the one or more storage media, to receive a decimal floating point number using a processor; and second program instructions, stored on at least one of the one or more storage medium, to cause a floating point unit to convert the decimal floating point number into a binary coded decimal number, wherein the floating point unit starts a conversion loop subsequent to a rounding loop starting, wherein the rounding loop and the conversion loop run in parallel once started.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Figure 1:
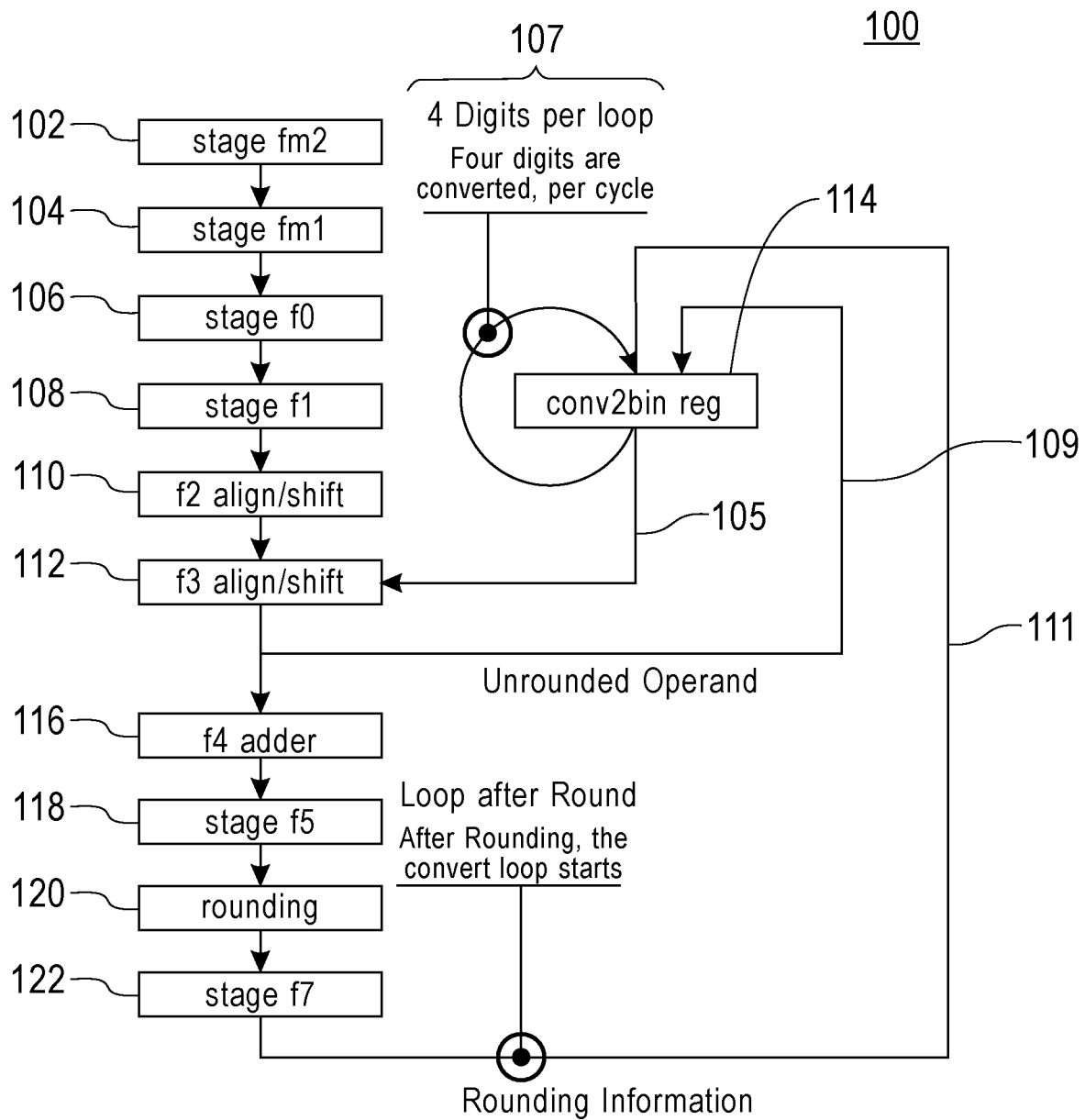
FIG. 1 illustrates a decimal floating point unit pipeline stage according to one or more embodiments of the present invention.

Turning now to a more detailed description of aspects of the invention, FIG. 1 illustrates a decimal floating point unit (DFU) pipeline stage 100 according to one or more embodiments of the present invention in which an unrounded operand is fed into a conversion loop containing a conversion to binary register (conv2bin reg) 114 and in parallel the operand is also passed to the rounding stages. Then after the rounding, the rounding information is passed to the conv2bin reg 114. In the case of 64 bit decimal floating point, which has 16 binary coded decimal (BCD) digits and therefore needs four loops, one or more embodiments save 4 cycles for the stages when compared to contemporary methods of conversion.

Still referring to FIG. 1, one embodiment of the present invention starts with the pipeline stage fm2 102 by receiving a decimal floating point (DFP) value and ending with the pipeline stage f7 122. FIG. 1 shows the data flow of converting from DFP point format to binary coded decimal (BCD) format. A DFP value is received by pipeline stage fm2 102 (indication, that an instruction is received to turn on power) from a register file (not shown). The DFP value further passes through pipeline stages fm1 104 (instruction code is decoded to control signals), f0 106 and f1 108 to unpack the data. The DFU 100 includes align/shift logic in pipeline stages f2 110 and f3 112. Pipelines stages f2 110 and f3 112 align and shift a floating point fraction depending on an exponent of the DFP value. The unrounded operand of the DFP value is supplied to conversion to binary register 114. The DFU 100 includes a pipeline stage f4 116 which is a binary adder and a pipeline stage f5 118. Pipeline stage f6 120, rounds a result and passes this value to pipeline stage f7 122 to pack the data. The rounding information is supplied in parallel with the conversion operand to the conversion to binary register 114. There are two parallel loops shown in the DFU 100 of FIG. 1. The first loop from pipeline stage f3, output 109, the conversion to binary register 114, output 105 back to pipeline stage f3 is the conversion loop, and the second loop from pipeline stages f4 116, f5 118, f6, 120, f7 122 output 111, conversion to binary register 114, output 105, stage f3 112 back to stage f4 is the rounding loop. The conversion to binary register 114 supplies a value back to the pipeline stage f3 112 which again aligns and shifts the value. The conversion to binary register 114 also supplies the value back to itself as feedback. The parallel loop conversion process uses four digits per loop 107 cycle.

As an example, in accordance with an embodiment, a DFP*10^exponent, such as 1.23456*10^3 is input and the following pipeline steps are executed to convert the DFP value to a BCD value. The BCD part is shifted, as the exponent sets the decimal operator: 1234.56. The unrounded data is converted into binary format and in parallel the rounding information is calculated: 0x4D2. If rounding should be done as determined at stage f3, then a 1 is added. A 64 bit DFP value breaks down to 16 binary coded decimal (BCD) digits needing 4 loops and finishes with a total of 12 cycles. For example, 4 stages: f0 to f3 (half of the pipeline), 4 cycles for the loop and 4 additional cycles through the remaining pipeline f4 to f7

Figure 2:
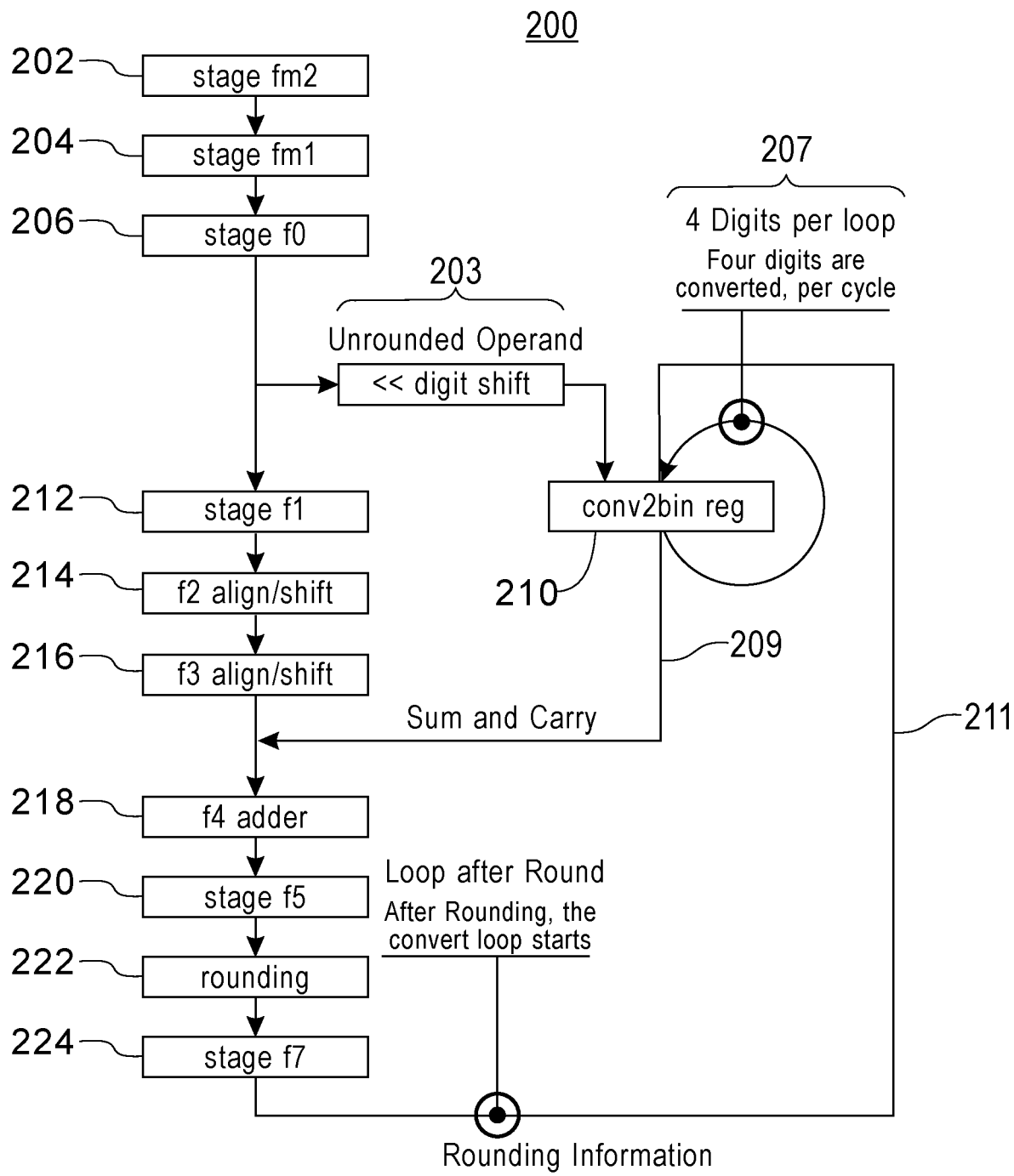
FIG. 2 illustrates a decimal floating point unit pipeline stage according to one or more embodiments of the present invention.

FIG. 2 illustrates a decimal floating point unit (DFU) pipeline stage 200 according to another embodiment of the present invention that shows the unrounded operand being fed into the conversion loop containing a conversion to binary register (conv2bin reg) 210 and in parallel the operand is also passed to the rounding stage ###. Then after the rounding, the rounding information is passed to the conv2bin reg 210. In the case of 128 bit decimal floating point, which has 34 binary coded decimal (BCD) digits and therefore needs eight loops, one or more embodiments, saves seven cycles for the stages when compared to contemporary approaches.

Still referring to FIG. 2, the embodiment of the present invention starts with the pipeline stage fm2 202 by receiving a decimal floating point (DFP) value and ending with the pipeline stage f7 224 with outputting line 211. FIG. 2 shows the data flow of converting from DFP point format to binary coded decimal (BCD) format. A DFP value is received by pipeline stage fm2 202 from a register file (not shown). The DFP value further passes through pipeline stages fm1 204 and f0 206. The value from pipeline stage f0 206 is supplied to a digit shift 203. The output of the digit shift 203 supplies an unrounded operant is supplied conversion to binary register 210. The value from pipeline stage f0 206 is also supplied to a pipeline stage f1 212. The DFU 200 includes align/shift logic in pipeline stages f2 214 and f3 216. Pipelines stage f2 214 and f3 216 align and shift a floating point fraction depending on an exponent of the DFP value. The DFU 200 includes a pipeline stage f4 which is a binary adder 218 and a pipeline stage f5 220 which are part of arithmetic stages. Pipeline stage 222, rounds a result and passes this value to pipeline stage f7 224 to update the data. The rounding information is supplied in parallel to the conversion to binary register 210. There are two parallel loops happening in the DFU 200. A first loop is a conversion loop and the second loop is a rounding loop. The conversion to binary register 210 supplies 209 a value (the result in the sum and carry format) back to the adder pipeline stage 218 which is added.

As an example, in accordance with an embodiment a DFP*10^exponent, such as 1.23456*10^3 is input, takes the following pipeline steps to convert from the DFP value to a BCD value. The BCD part is shifted, as the exponent sets the decimal operator, Sample: 1234.56. The unrounded data is converted into binary format and in parallel the rounding information is calculated, Sample: 0x4D2 Rounding information. If rounding should be done then a 1 is added. A 128 bit DFP value breaks down to 34 binary coded decimal (BCD) digits needing 8 loops and a finishes with a total of 13 cycles with 4 loops 207.

Figure 3:
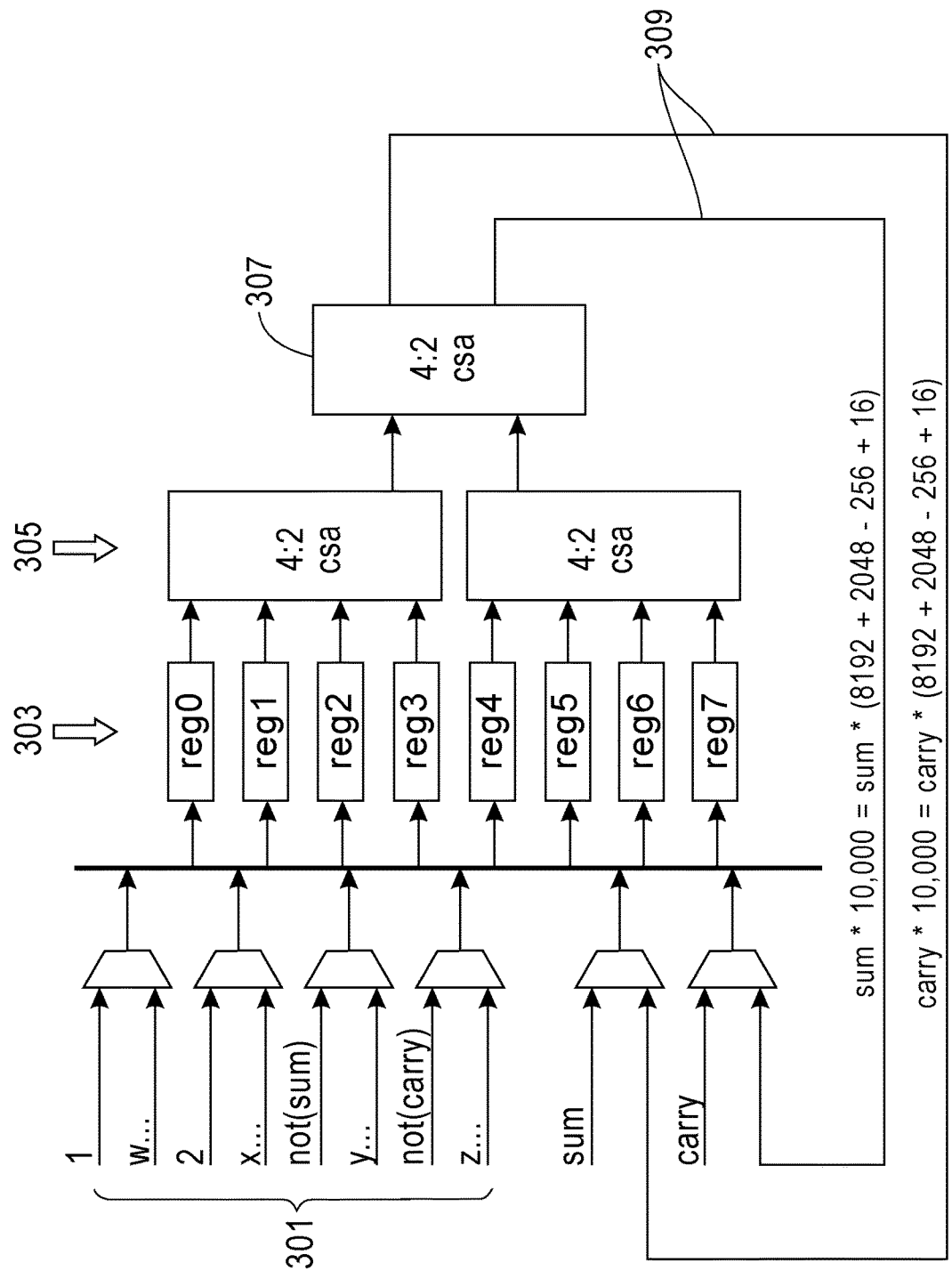
FIG. 3 illustrates hardware for rounding correction in addition to sign correction according to one or more embodiments of the present invention.

Referring to FIG. 3, a BCD to binary conversion register with rounding correction in addition to the sign correction is generally shown in accordance with an embodiment of the invention. The inputs 301 (which represents the number, rounding and sign) are added and are supplied to a plurality of registers 303. The two stages of 4:2 carry-sum-adder (csa) 305, 307 receive the outputs of the registers 303 and reduce inputs 301 to sum and carry, which are then getting fed back 309 into their inputs.

In the embodiment shown in FIG. 3, the BCD value is already a binary value, but with a different significance than value. The least significant digit has the significance of $10^0=1$. In FIG. 3, the least significant digit z is input into the carry-sum-half-adder with significance of 1. Proceeding with the second least significant digit y, it is input into the carry-sum-half-adder twice, once with a significance of eight and once with a significance of two ($8+2=2^3+2^1=10$), as an example. The BCD significance is ten and having that at a base of binary, requires a shift of that digit to the right binary position. In case the significance is an eight, there is a need to shift three bits to the left. For x and w, this is done accordingly. After the first cycle, the conversion register shifts the sum and carry by a factor if 10000 and feeds it back to the input. The loop is not done until all digits are converted. If the decimal floating point input operand is negative, a correction needs to be done. The decimal floating point stores the sign and magnitude separately. Sign and rounding corrections occur in last conversion loop for the two's complement number representation. In the case of a negative sign of the inputted DFP number, the mux input of the inverted sum and the inverted carry are selected. In addition, either an additional 1 or 2 are selected as inputs 301 to the carry-sum-half-adders. In the case of a positive sign of the inputted DFP number, the sum and carry are selected and either an additional 0 or 1 are selected to do rounding.

Figure 4:
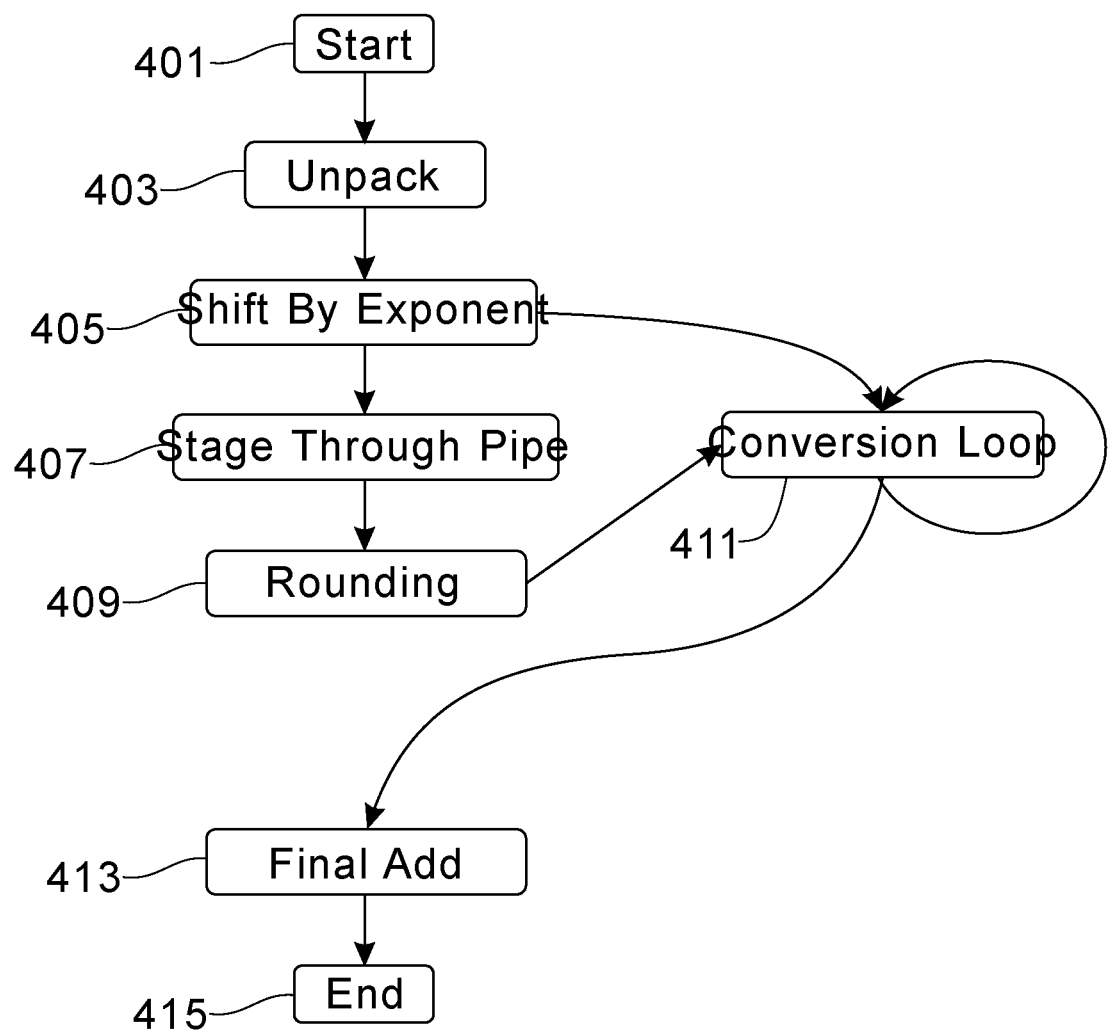
FIG. 4 illustrates a flow diagram of a process according to one or more embodiments of the present invention.

Referring to FIG. 4 a flowchart for parallel rounding and correction is generally shown according to an embodiment of the invention. A DFP value is received at block 401. That DFP value is unpacked at block 403 into an significand and exponent. The DFP value is shifted by an exponent at block 405. The DFP shifted value is supplied to a conversion loop at block 411 and to a pipeline at block 407. The output of the pipeline from block 407 is supplied to a rounding unit at block 409. The output of the rounding unit from block 409 is supplied to the conversion loop at block 411. The conversion loop is conducting, in parallel, the conversions of the operand and the rounding of the DFP value into a binary value. Once all of the necessary cycles are completed in the conversion loop at block 411 an output is supplied to a final add process at block 413 and the flow process ends at block 415. These blocks may be used in the DFUs of either FIG. 1 or FIG. 2.

Figure 5:
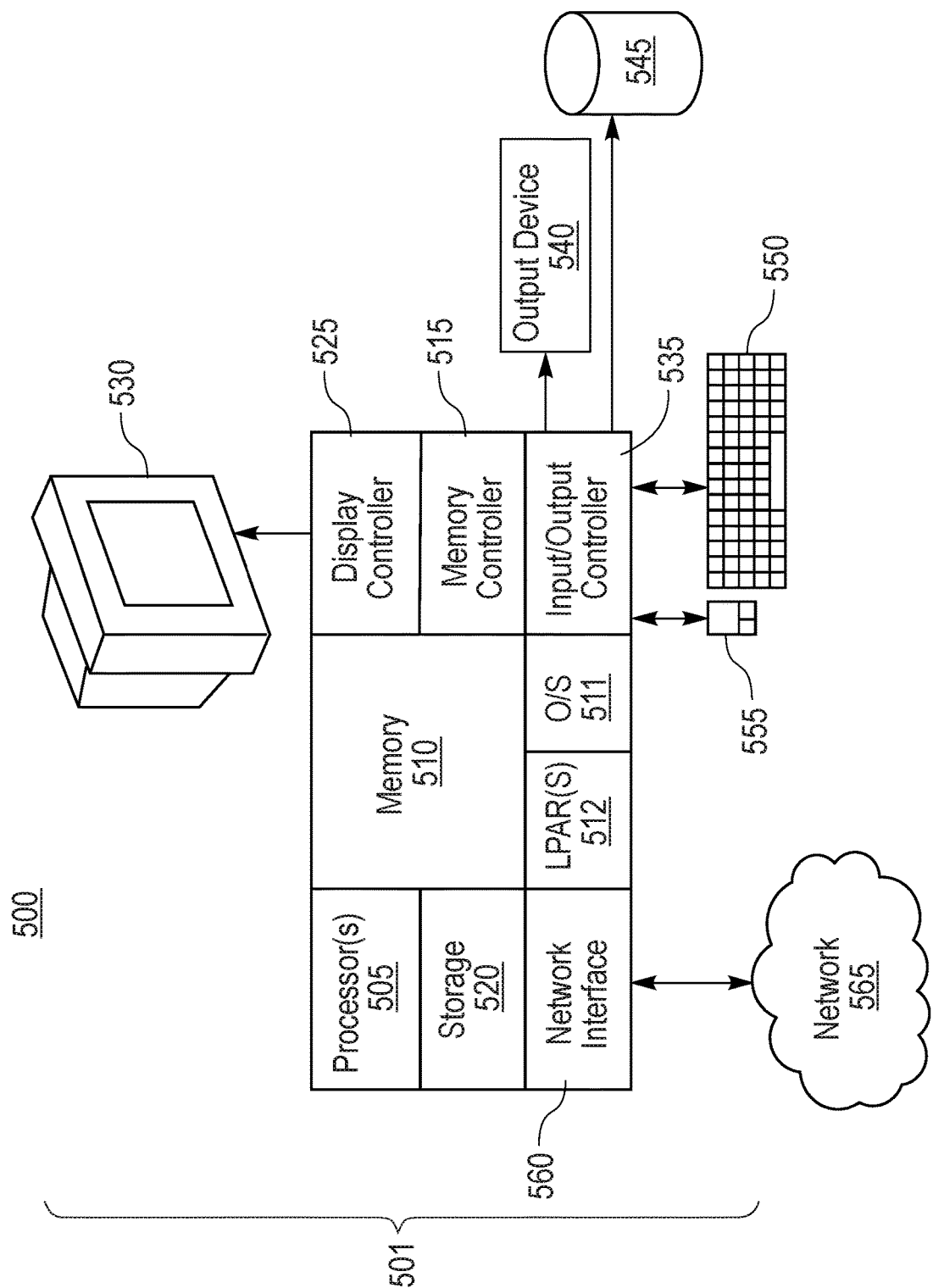
FIG. 5 illustrates a computer system according to one or more embodiments of the present invention.

Turning now to FIG. 5, a computer system 500 for parallelized rounding for DFP to BCD conversion is generally shown in accordance with one or more embodiments of the present invention. The methods described herein can be implemented in hardware, software (e.g., firmware), or a combination thereof. In an exemplary embodiment, the methods described herein are implemented in hardware as part of the microprocessor of a special or general-purpose digital computer, such as a personal computer, workstation, minicomputer, or mainframe computer. The system 500 therefore may include general-purpose computer or mainframe 501 capable of running multiple instances of an O/S simultaneously.

In an exemplary embodiment, in terms of hardware architecture, as shown in FIG. 5, the computer 501 includes one or more processors 505, memory 510 coupled to a memory controller 515, and one or more input and/or output (I/O) devices 540, 545 (or peripherals) that are communicatively coupled via a local input/output controller 535. The input/output controller 535 can be, for example but not limited to, one or more buses or other wired or wireless connections, as is known in the art. The input/output controller 535 may have additional elements, which are omitted for simplicity, such as controllers, buffers (caches), drivers, repeaters, and receivers, to enable communications. Further, the local interface may include address, control, and/or data connections to enable appropriate communications among the aforementioned components. The input/output controller 535 may include a plurality of sub-channels configured to access the output devices 540 and 545. The sub-channels may include fiber-optic communications ports.

The processor 505 is a hardware device for executing software, particularly that stored in storage 520, such as cache storage, or memory 510. The processor 505 can be any custom made or commercially available processor, a central processing unit (CPU), an auxiliary processor among several processors associated with the computer 501, a semiconductor based microprocessor (in the form of a microchip or chip set), a macroprocessor, or generally any device for executing instructions.

The memory 510 can include any one or combination of volatile memory elements (e.g., random access memory (RAM, such as DRAM, SRAM, SDRAM, etc.)) and non-volatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 510 may incorporate electronic, magnetic, optical, and/or other types of storage media. Note that the memory 510 can have a distributed architecture, where various components are situated remote from one another, but can be accessed by the processor 505.

The instructions in memory 510 may include one or more separate programs, each of which comprises an ordered listing of executable instructions for implementing logical functions. In the example of FIG. 5, the instructions in the memory 510 a suitable operating system (OS) 511. The operating system 511 essentially controls the execution of other computer programs and provides scheduling, input-output control, file and data management, memory management, and communication control and related services.

The memory 510 may include multiple logical partitions (LPARs) 512, each running an instance of an operating system. The LPARs 512 may be managed by a hypervisor, which may be a program stored in memory 510 and executed by the processor 505.

In an exemplary embodiment, a conventional keyboard 550 and mouse 555 can be coupled to the input/output controller 535. Other output devices such as the I/O devices 540, 545 may include input devices, for example but not limited to a printer, a scanner, microphone, and the like. Finally, the I/O devices 540, 545 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 500 can further include a display controller 525 coupled to a display 530. In an exemplary embodiment, the system 500 can further include a network interface 560 for coupling to a network 565. The network 565 can be an IP-based network for communication between the computer 501 and any external server, client and the like via a broadband connection. The network 565 transmits and receives data between the computer 501 and external systems. In an exemplary embodiment, network 565 can be a managed IP network administered by a service provider. The network 565 may be implemented in a wireless fashion, e.g., using wireless protocols and technologies, such as WiFi, WiMax, etc. The network 565 can also be a packet-switched network such as a local area network, wide area network, metropolitan area network, Internet network, or other similar type of network environment. The network 565 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 501 is a PC, workstation, intelligent device or the like, the instructions in the memory 510 may further include a basic input output system (BIOS) (omitted for simplicity). The BIOS is a set of essential software routines that initialize and test hardware at startup, start the OS 511, and support the transfer of data among the hardware devices. The BIOS is stored in ROM so that the BIOS can be executed when the computer 501 is activated.

When the computer 501 is in operation, the processor 505 is configured to execute instructions stored within the memory 510, to communicate data to and from the memory 510, and to generally control operations of the computer 501 pursuant to the instructions.

The present invention may be a system, a method, and/or a computer program product. The computer program product may include a computer readable storage medium (or media) having computer readable program instructions thereon for causing a processor to carry out aspects of the present invention.

Aspects of the invention are not limited in their application to the details of construction and the arrangement of the components set forth in the following description or illustrated in the drawings. The embodiments of the invention described herein are applicable to other embodiments or are capable of being practiced or carried out in various ways. The phraseology and terminology employed herein are for the purpose of description and should not be regarded as limiting. As will be appreciated by one skilled in the art, aspects of the present invention can be embodied as a system, method or computer program product.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method comprising:
   receiving, using a processor, a decimal floating point number; and
   using a floating point unit within the processor to convert the decimal floating point number into a binary coded decimal number, wherein the floating point unit starts a conversion loop subsequent to a rounding loop starting, wherein the rounding loop and the conversion loop run in parallel once started.

2. The method according to claim 1, wherein the floating point unit finishes the rounding loop and outputs a result of the rounding loop.

3. The method according to claim 1, wherein the floating point unit uses a pipeline having a first plurality of stages as part of the conversion loop.

4. The method according to claim 3, wherein the pipeline further includes a first plurality of shift registers as part of the conversion loop.

5. The method according to claim 4, wherein the pipeline further includes a second plurality of stages as part of the rounding loop.

6. The method according to claim 5, wherein the pipeline further includes a second plurality of shift registers as part of the rounding loop.

7. The method according to claim 1, wherein the conversion loop uses a conversion register which outputs a result which is added to the rounding loop.

8. A system comprising one or more processors for executing computer readable instructions, the computer readable instructions controlling the one or more processors to perform operations comprising:
receiving a decimal floating point number; and
converting, by a floating point unit within the one or more processors, the decimal floating point number into a binary coded decimal number, wherein the converting is performed by a conversion loop that is started subsequent to a rounding loop starting, wherein the rounding loop and the conversion loop run in parallel once started.

9. The system according to claim 8, wherein the floating point unit finishes the rounding loop and outputs a result of the rounding loop.

10. The system according to claim 8, wherein the floating point unit uses a pipeline having a first plurality of stages as part of the conversion loop.

11. The system according to claim 10, wherein the pipeline further includes a first plurality of shift registers as part of the conversion loop.

12. The system according to claim 11, wherein the pipeline further includes a second plurality of stages as part of the rounding loop.

13. The system according to claim 12, wherein the pipeline further includes a second plurality of shift registers as part of the rounding loop.

14. The system according to claim 8, wherein the conversion loop uses a conversion register which outputs a result which is added to the rounding loop.

15. A computer program product comprising:
one or more computer-readable storage media, wherein the one or more computer-readable storage media are not transitory signals per se;
first program instructions, stored on at least one of the one or more computer-readable storage media, to receive a decimal floating point number using a processor; and
second program instructions, stored on at least one of the one or more computer-readable storage media, to cause a floating point unit to convert the decimal floating point number into a binary coded decimal number, wherein the floating point unit starts a conversion loop subsequent to a rounding loop starting, wherein the rounding loop and the conversion loop run in parallel once started.

16. The computer program product according to claim 15, wherein the floating point unit finishes the rounding loop with a result of the rounding loop.

17. The computer program product according to claim 15, wherein the floating point unit uses a pipeline having a first plurality of stages as part of the conversion loop.

18. The computer program product according to claim 17, wherein the pipeline further includes a first plurality of shift registers as part of the conversion loop.

19. The computer program product according to claim 18, wherein the pipeline further includes a second plurality of stages as part of the rounding loop.

20. The computer program product according to claim 15, wherein the conversion loop uses a conversion register which outputs a result which is added to the rounding loop.

\* \* \* \* \*